(12) United States Patent
Nguyen et al.

(10) Patent No.: US 11,171,054 B2
(45) Date of Patent: Nov. 9, 2021

(54) SELECTIVE DEPOSITION WITH SAM FOR FULLY ALIGNED VIA

(71) Applicant: INTERNATIONAL BUSINESS MACHINES CORPORATION, Armonk, NY (US)

(72) Inventors: Son Nguyen, Schenectady, NY (US); Rudy J. Wojtecki, San Jose, CA (US); Noel Arellano, Gilroy, CA (US); Alexander Edward Hess, Redwood Estates, NY (US); Thomas Jasper Haigh, Jr., Claverack, NY (US); Cornelius Brown Peethala, Slingerlands, NY (US); Balasubramanian S. Pranatharthi Haran, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/837,075

(22) Filed: Apr. 1, 2020

(65) Prior Publication Data

US 2021/0313228 A1    Oct. 7, 2021

(51) Int. Cl.
*H01L 21/768* (2006.01)
*H01L 21/02* (2006.01)
(Continued)

(52) U.S. Cl.
CPC .. *H01L 21/76897* (2013.01); *H01L 21/02118* (2013.01); *H01L 21/02348* (2013.01);
(Continued)

(58) Field of Classification Search
None
See application file for complete search history.

(56) References Cited

U.S. PATENT DOCUMENTS 7,615,779 B2   11/2009   Zhitenev
7,629,272 B2   12/2009   Waldfried et al.
(Continued)

FOREIGN PATENT DOCUMENTS

EP          3503164 A1    6/2019

OTHER PUBLICATIONS

Au et al., "Selective Chemical Vapor Deposition of Manganese Self-Aligned Capping Layer for Cu Interconnections n Microelectronics", Journal of the Electrochemical Society. vol. 157, No. 6. Jun. 1, 2010. pp. D341-D345.

(Continued)

*Primary Examiner* — Alexander G Ghyka
(74) *Attorney, Agent, or Firm* — Tutunjian & Bitetto, P.C.; Jeffrey S. LaBaw (57) ABSTRACT

A method is presented for forming a fully aligned via (FAV) structure. The method includes depositing a first dielectric adjacent a conductive material, forming a surface aligned monolayer (SAM) over the conductive material, the SAM defining a long chain SAM formed by a layer-by-layer growth technique, depositing a second dielectric over the SAM and the first dielectric, performing chemical mechanical polishing (CMP) to planarize the second dielectric, and etching the SAM to form the FAV structure.

16 Claims, 10 Drawing Sheets

(51) Int. Cl.
  *H01L 23/535* (2006.01)
  *H01L 21/311* (2006.01)
  *H01L 23/532* (2006.01)
  *H01L 21/3105* (2006.01)

(52) U.S. Cl.
  CPC .. *H01L 21/31053* (2013.01); *H01L 21/31133* (2013.01); *H01L 23/535* (2013.01); *H01L 23/5329* (2013.01)

(56) References Cited

U.S. PATENT DOCUMENTS

| | | | |
|---|---|---|---|
| 7,741,014 | B2 | 6/2010 | Ryan et al. |
| 8,974,870 | B2 | 3/2015 | Baklanov et al. |
| 10,777,411 | B1* | 9/2020 | Nguyen .............. H01L 21/0271 |
| 2012/0156890 | A1 | 6/2012 | Yim et al. |
| 2019/0287807 | A1* | 9/2019 | Basu ................. H01L 21/76801 |
| 2020/0058548 | A1* | 2/2020 | Han .................. H01L 21/76816 |

OTHER PUBLICATIONS

Briggs et al., "Fully aligned via integration for extendibility of interconnects to beyond the 7 nm node", 2017 IEEE International Electron Devices Meeting. Dec. 2, 2017. pp. 1-22.
Grill et al., "Progress in the development and understanding of advanced low k and ultralow k dielectrics for very arge-scale integrated interconnects—State of the art", Applied Physics Review. vol. 1, No. 1. Mar. 15, 2014. pp. 1-18.
Guo, Lei, "Selective Chemistry of Metal Oxide Atomic Layer Deposition on Si Based Substrate Surfaces", UC Riverside Electronic Theses and Dissertations, https://escholarship.org/US/item/55t058st. 2015. pp. 1-120.
Hashemi, Fatemeh Sadat Minaye, "Area-selective atomic layer deposition of metal oxides on metal-dielectric Patterns", Committee on Graduate Studies of Stanford University, http://puri.stanford.edu/sg460mt0711. Aug. 2016. pp. 1-261.
Mameli et al., "Area-Selective Atomic Layer Deposition of SiO2 Using Acetylacetone as Chemoselective Inhibitor in an ABC-Type Cycle", ACS Nano. vol. 11, No. 9. Sep. 26, 2017. pp. 9303-9311.

* cited by examiner

SELECTIVE DEPOSITION WITH SAM FOR FULLY ALIGNED VIA

BACKGROUND

The present invention relates generally to semiconductor devices, and more specifically, to selective deposition of low-k silicon oxycarbide (SiCOH) with surface aligned molecules or monolayers (SAM) for creating fully aligned vias (FAVs).

Integrated circuits commonly include electrically conductive microelectronic structures, known as vias, to electrically connect metal lines or other interconnects above the vias to metal lines or other interconnects below the vias. Vias are usually formed by a lithographic process. Representatively, a photoresist layer can be spin coated over a dielectric layer, the photoresist layer can be exposed to patterned actinic radiation through a patterned mask, and then the exposed layer can be developed in order to form an opening in the photoresist layer. Next, an opening for the via can be etched in the dielectric layer by using the opening in the photoresist layer as an etch mask. This opening is referred to as a via opening. The via opening can be filled with one or more metals or other conductive materials to form the via.

SUMMARY

In accordance with an embodiment, a method is provided for forming a fully aligned via (FAV) structure. The method includes forming depositing a first dielectric adjacent a conductive material, forming a surface aligned monolayer (SAM) over the conductive material, the SAM defining a long chain SAM formed by a layer-by-layer growth technique, depositing a second dielectric over the SAM and the first dielectric, performing chemical mechanical polishing (CMP) to planarize the second dielectric, and etching the SAM to form the FAV structure.

In accordance with another embodiment, a method is provided for forming a fully aligned via (FAV) structure. The method includes depositing a first dielectric adjacent a conductive material, forming a first surface aligned monolayer (SAM) over the conductive material, applying a first thermal and UV cure, forming a second SAM over and in direct contact with the first SAM, applying a second thermal and UV cure, forming a third SAM over and in direct contact with the second SAM, depositing a second dielectric over the third SAM and the first dielectric, performing chemical mechanical polishing (CMP) to planarize the second dielectric, and etching the SAM to form the FAV structure. Alternatively, the SAM can also be a single long and thicker SAM for the same processing without the second and third SAM bonding processes.

In accordance with yet another embodiment, a semiconductor structure is provided. The semiconductor structure includes a first dielectric disposed adjacent a conductive material, a first surface aligned monolayer (SAM) disposed over the conductive material, a second SAM disposed over and in direct contact with the first SAM, a third SAM disposed over and in direct contact with the second SAM, the first, second, and third SAMs collectively forming a long chain SAM, and a second dielectric disposed over the third SAM and the first dielectric, the second dielectric planarized by chemical mechanical polishing (CMP).

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for growing a low-k silicon oxycarbide (SiCOH) selectively on top of a dielectric. Successfully growing one type of dielectric on top of another type of dielectric has great potential for a variety of semiconductor applications, including the creation of fully aligned vias (FAVs). One issue with such growth is lateral deposition, which impacts the implementation of thicker selective dielectric growth.

Embodiments in accordance with the present invention provide techniques and processes for alleviating such concerns by employing long chain self-assembled monolayers or surface aligned monolayers (SAMs) with stable cross-linking. By using long chain cross-linking surface SAMs bonded to a conductive surface or region, lateral growth can be successfully inhibited. Polymerization can occur by thermal and ultraviolet (UV) cure. The polymerization process can be triggered by a number of stimuli, including temperature. In one instance, a temperature of about 80-100° C. can start this polymerization process, if it is in an inert environment. The removal of the long chain SAM results in the formation of a selective FAV structure.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
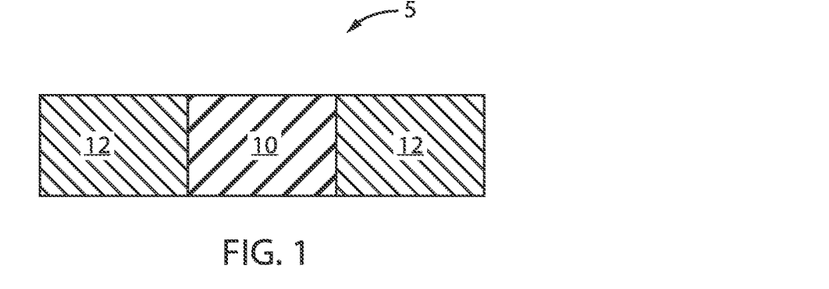
FIG. 1 is a cross-sectional view of a semiconductor structure including a plurality of alternating dielectric and conductive regions, in accordance with an embodiment of the present invention.

FIG. 1 is a cross-sectional view of a semiconductor structure including a plurality of alternating dielectric and conductive regions, in accordance with an embodiment of the present invention.

Structure 5 illustrates a substrate having alternating regions of a conducting material 10 and a dielectric material 12.

The conductive material 10 can be, e.g., copper (Cu).

The dielectric material 12 can be, e.g., an inter-layer dielectric (ILD).

In a non-limiting example, the ILD 12 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the ILD 12 can be a low-k oxide.

Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The conductive metal can be deposited by a suitable deposition process, for example, CVD, PECVD, PVD, plating, thermal or e-beam evaporation, and sputtering.

Figure 2:
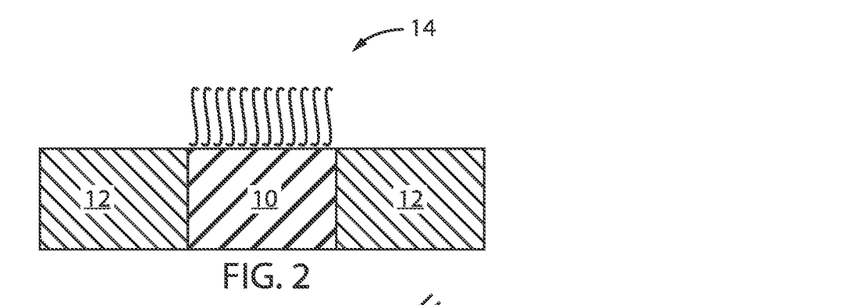
FIG. 2 is a cross-sectional view of the semiconductor structure of FIG. 1 where a first surface aligned monolayer (SAM) is formed over the conductive regions, in accordance with an embodiment of the present invention.

FIG. 2 is a cross-sectional view of the semiconductor structure of FIG. 1 where a first surface aligned monolayer (SAM) is formed over the conductive regions, in accordance with an embodiment of the present invention. The SAMs can be applied over selected surfaces by wet processing dipping in solution, by spin-on and rinse as in standard lithography, or by vapor or chemical vapor deposition (CVD) under proper conditions.

In various example embodiments, a first SAM 14 is formed over the conductive regions 10.

As utilized herein, "self-assembled monolayer" or "surface aligned monolayer" ("SAM") generally refers to a layer of molecules that are attached (e.g., by a chemical bond) to a surface and that have adopted a preferred orientation with respect to that surface and even with respect to each other. The SAM usually includes an organized layer of amphiphilic molecules in which one end of the molecule, the "head group" shows a specific, reversible affinity for a substrate. Selection of the head group will depend on the application of the SAM, with the type of SAM compounds based on the substrate utilized. Generally, the head group is connected to an alkyl chain or fluorinated alkyl chain in which a tail or "terminal end" can be functionalized, for example, to vary wetting and interfacial properties. The molecules that form the SAM will selectively attach to one material over another material (e.g., metal vs. dielectric) and if of sufficient density, can successfully operate subsequent deposition allowing for selective deposition on materials not coated with the SAM, etc.

Examples of suitable SAM molecules 14 which can be utilized in accordance with the implementations described herein include the materials described hereinafter, including combinations, mixtures, and grafts thereof, in addition to other SAM molecules having characteristics suitable for blocking deposition of subsequently deposited materials in a semiconductor fabrication process. In one implementation, the SAM molecules 14 can be carboxylic acid materials, such as methylcarboxylic acids, ethycarboxylic acids, propylcarboxylic acids, butylcarboxylic acids, pentylcarboxylic acids, hexylcarboxylic acids, heptylcarboxylic acids, octylcarboxylic acids, nonylcarboxylic acids, decylcarboxylic acids, undecylcarboxylic acids, dodecylcarboxylic acids, tridecylcarboxylic acids, tetradecylcarboxylic acids, pentadecylcarboxylic acids, hexadecylcarboxylic acids, heptadecylcarboxylic acids, octadecylcarboxylic acids, and nonadecylcarboxylic acids.

In one implementation, the SAM molecules 14 can be hydroxamic acid materials, such as suberoyl anilide hydroxamic acids, cinnamyl hydroxamic acid, sulfonamide hydroxamic acids, succinimide hydroxamic acids, pyrimidine-derived hydroxamic acids, heterocyclic-amide hydroxamic acids, and cyclic hydroxamic acids.

In one implementation, the SAM molecules 14 can be phosphonic acid materials, such as methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, decylphosphonic acid, undecylphosphonic acid, dodecylphosphonic acid, tridecylphosphonic acid, tetradecyphosphonic acid, pentadecylphosphonic acid, hexadecylphosphonic acid, heptadecylphosphonic acid, octadecylphosphonic acid, and nonadecylphosphonic acid.

In another implementation, the SAM molecules 14 can be thiol materials, such as methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, and nonadecanethiol.

In another implementation, the SAM molecules 14 can be silylamine materials, such as tris(dimethylamino)methylsilane, tris(dimethylamino)ethylsilane, tris(dimethylamino)propylsilane, tris(dimethylamino)butylsilane, tris(dimethylamino)pentylsilane, tris(dimethylamino)hexylsilane, tris(dimethylamino)heptylsilane, tris(dimethylamino)octylsilane, tris(dimethylamino)nonylsilane, tris(dimethylamino)decylsilane, tris(dimethylamino)undecylsilane tris(dimethylamino)dodecylsilane, tris(dimethylamino)tridecylsilane, tris(dimethylamino)tetradecylsilane, tris(dimethylamino)pentadecylsilane, tris(dimethylamino)hexadecylsilane, tris(dimethylamino)heptadecylsilane, tris(dimethylamino)octadecylsilane, and tris(dimethylamino)nonadecylsilane.

In another implementation, the SAM molecules 14 can be chlorosilane materials, such as methyltrichlorosilane, ethyltrichlorosilane, propyltrichlorosilane, butyltrichlorosilane, pentyltrichlorosilane, hexyltrichlorosilane, heptyltrichlorosilane, octyltrichlorosilane, nonyltrichlorosilane, decyltrichlorosilane, undecyltrichlorosilane, dodecyltrichlorosilane, tridecyltrichlorosilane, tetradecyltrichlorosilane, pentadecyltrichlorosilane, hexadecyltrichlorosilane, heptadecyltrichlorosilane, octadecyltrichlorosilane, and nonadecyltrichlorosilane.

In another embodiment, the SAM molecules 14 can be oxysilane materials, such as methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, nonyltrimethoxysilane, nonyltriethoxysilane, decyltrimethoxysilane, decyltriethoxysilane, undecyltrimethoxysilane, undecyltrethoxysilane, dodecyltrimethoxysilane, dodecyltriethoxysilane, tridecyltrimethoxysilane, tridecyltriethoxysilane, tetradecyltrimethoxysilane, tetradecyltriethoxysilane, pentadecyltrimethoxysilane, pentadecyltriethoxysilane, hexadecyltrimethoxysilane, hexadecyltroethoxysilane, heptadecyltrimethoxysilane, heptadecyltriethoxysilane, octadecyltrimethoxylsilane octadecyltriethoxysilane, nonadecyltrimethoxysilane, and nonadecyltriethoxysilane.

In another implementation, the SAM molecules 14 can have a fluorinated R group, such as (1,1,2,2-perfluorodecyl)trichlorosilane, trichloro(1,1,2,2-perfluorooctyl)silane, (trideca-fluoro-1,1,2,2-tetrahydrooctyl)trichlorosilane, (tridecafluoro-1,1,2,2-tetrahydro-octyl)triethoxysilane, (tridecafluoro-1,1,2,2-tetrahydrooctyl)methyldichlorosilane, (tridecafluoro-1,1,2,2-tetrahydrooctyl)dimethylchlorosilane, and (heptadecafluoro-1,1,2,2-tetrahydrodecyl)trichlorosilane, among others.

Figure 3:
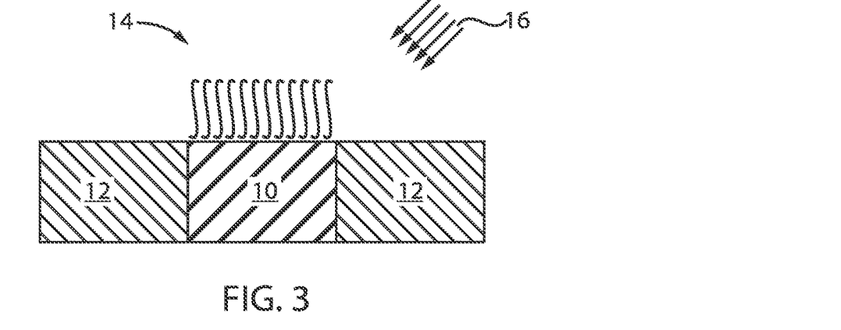
FIG. 3 is a cross-sectional view of the semiconductor structure of FIG. 2 where a thermal cure and an ultraviolet (UV) cure take place, in accordance with an embodiment of the present invention.

FIG. 3 is a cross-sectional view of the semiconductor structure of FIG. 2 where a thermal cure and an ultraviolet (UV) cure take place, in accordance with an embodiment of the present invention.

In various example embodiments, a thermal cure and UV cure 16 is applied to the first SAM 14. The thermal cure and UV cure 16 enables cross-link bonding between the first SAM 14 and subsequent SAMs deposited over the first SAM 14.

Figure 4:
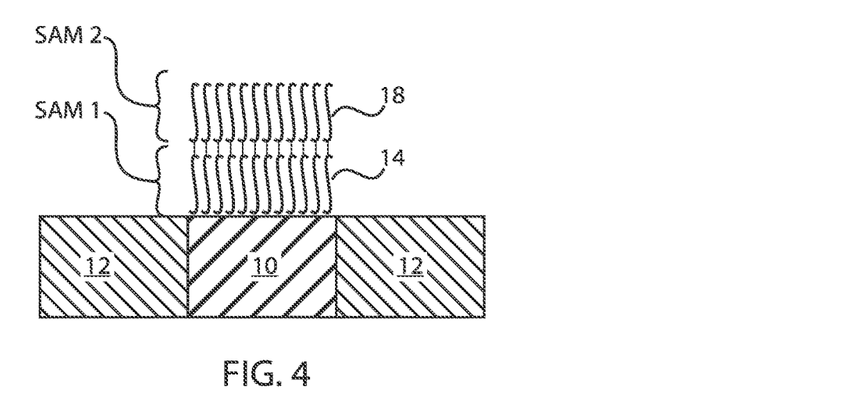
FIG. 4 is a cross-sectional view of the semiconductor structure of FIG. 3 where a second SAM is deposited over the first SAM, in accordance with an embodiment of the present invention.

FIG. 4 is a cross-sectional view of the semiconductor structure of FIG. 3 where a second SAM is deposited over the first SAM, in accordance with an embodiment of the present invention.

In various example embodiments, a second SAM 18 is deposited over the first SAM 14. The second SAM 18 is attached or bonded to the first SAM 14 by the thermal cure and UV care 16. Thus, a first layer or level of SAM is formed and then a second layer or level of SAM is formed.

Figure 5:
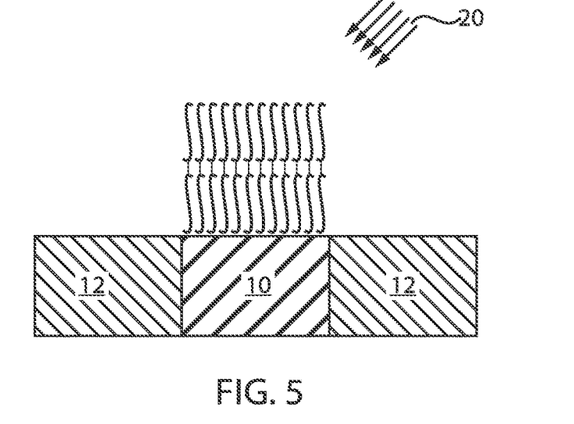
FIG. 5 is a cross-sectional view of the semiconductor structure of FIG. 4 where a further thermal cure and UV cure take place, in accordance with an embodiment of the present invention.

FIG. 5 is a cross-sectional view of the semiconductor structure of FIG. 4 where a further thermal cure and UV cure take place, in accordance with an embodiment of the present invention.

In various example embodiments, a further thermal cure and UV cure 20 take place. The thermal cure and UV cure 20 enables cross-link bonding between the second SAM 16 and subsequent SAMs deposited over the second SAM 16. As such, at this point of the process, a second SAM 16 has been attached or bonded to the first SAM 14.

Figure 6:
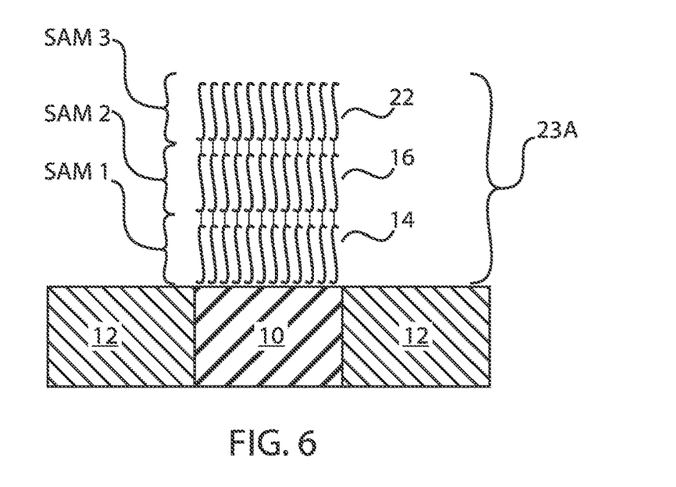
FIG. 6 is a cross-sectional view of the semiconductor structure of FIG. 5 where a third SAM is deposited over the second SAM to form a long chain SAM, in accordance with an embodiment of the present invention.

FIG. 6 is a cross-sectional view of the semiconductor structure of FIG. 5 where a third SAM is deposited over the second SAM to form a long chain SAM, in accordance with an embodiment of the present invention.

In various example embodiments, a third SAM 22 is deposited over the second SAM 16 to form a long chain SAM 23A. Long chain SAM 23A includes first SAM 14, second SAM 16, and third SAM 22. Thus, the long chain SAM 23A includes 3 layers or 3 levels in a stacked configuration. The long chain SAM 23A has a length of about 3 nm to about 30 nm. At a minimum, the long chain SAM 23A is 4-5 nm and at a maximum the long chain SAM is 25-30 nm. The long chain SAM 23A is stable and does not tilt or flop down. The long chain SAM 23A remains substantially vertical because of the cross-link bonding between the SAMs 14, 16, 22. Alternatively, the SAM can also be a single long and thicker SAM for the same processing without second and third SAM bonding processes.

Figure 7:
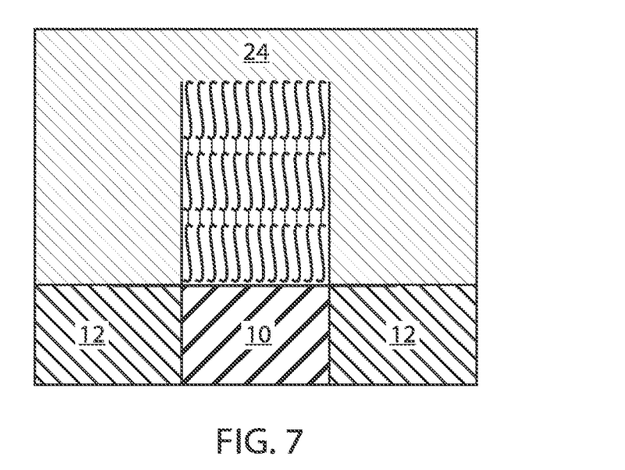
FIG. 7 is a cross-sectional view of the semiconductor structure of FIG. 6 where an inter-layer dielectric (ILD) is deposited, in accordance with an embodiment of the present invention.

FIG. 7 is a cross-sectional view of the semiconductor structure of FIG. 6 where an inter-layer dielectric (ILD) is deposited, in accordance with an embodiment of the present invention.

In various example embodiments, an inter-layer dielectric (ILD) 24 is deposited. In one example, ILD 24 is a low-k silicon oxycarbide (SiCOH) using Organisilicon Precursors such as Octamethyl Cyclotetrasiloxane (OMCTS) and Tetramethoxyl Silane (TMOS) and Oxygen. The ILD 24 can be deposited by flowable chemical vapor deposition (FCVD) at a low temperature of 20-200° C. Alternatively, the ILD 24 can also be deposited by Chemical Vapor Deposition (CVD), Plasma Enhanced Chemical Vapor Deposition (PECVD), Atomic Layer Deposition (ALD), Plasma Assisted Atomic Layer Deposition (PA ALD), Physical Vapor Deposition (PVD) processes at the 20-200° C. range for the same purpose. The ILD 24 directly contacts the dielectric regions 12 and covers or encompasses the long chain SAM 23A.

Figure 8:
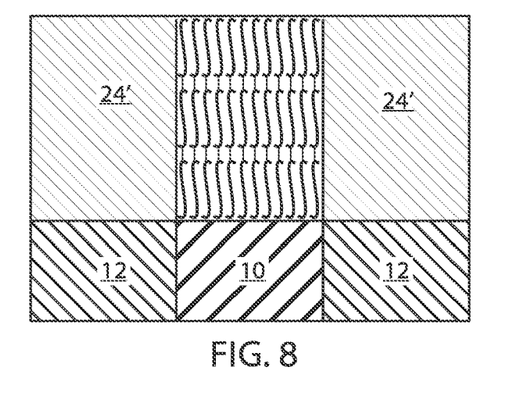
FIG. 8 is a cross-sectional view of the semiconductor structure of FIG. 7 where chemical-mechanical planarization (CMP) is performed, in accordance with an embodiment of the present invention.

FIG. 8 is a cross-sectional view of the semiconductor structure of FIG. 7 where chemical-mechanical planarization (CMP) is performed, in accordance with an embodiment of the present invention.

In various example embodiments, chemical-mechanical planarization (CMP) is performed so that a top surface of the remaining ILD 24' is flush with a top surface of the long chain SAM 23A.

After the CMP is performed, UV cure at higher processing temperature (<=400° C. with 200-300° C. range preferable, 30-300 second UV time in inert ambient like Ar or He) can be implemented to improve the ILD 24 or low-k silicon oxycarbide (SiCOH).

Figure 9:
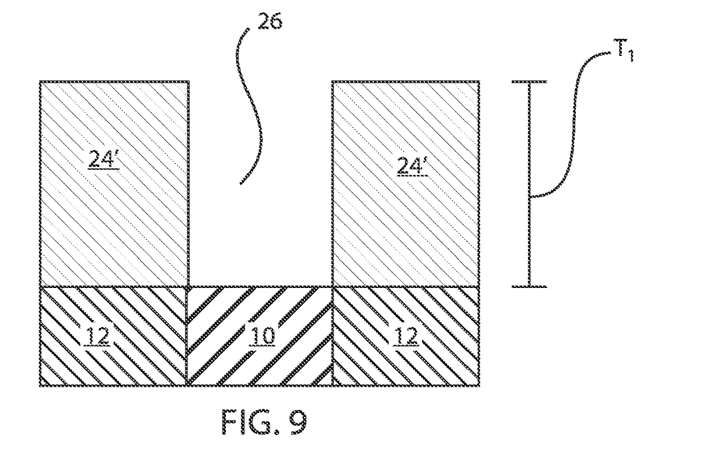
FIG. 9 is a cross-sectional view of the semiconductor structure of FIG. 8 where the long chain SAM is removed, in accordance with an embodiment of the present invention.

FIG. 9 is a cross-sectional view of the semiconductor structure of FIG. 8 where the long chain SAM is removed, in accordance with an embodiment of the present invention.

In various example embodiments, the long chain SAM 23A is removed to create an opening 26. The long chain SAM 23A can be removed by dry etch or wet etch. The opening 26 can be a via for a fully aligned via (FAV) structure.

This results in growing a low-k SiCOH 24' directly on dielectric regions 12. The thickness $T_1$ of the dielectric 24' is greater than conventional achieved thicknesses.

Therefore, in reference to FIGS. 1-9, an advanced SAM with long chains and stable cross-linking is constructed that enables deposition of self-planarized partial selective FCVD SiCOH on low-k dielectrics. By employing a long chain cross-linking surface SAM bonded to metal, lateral growth can be inhibited. After FCVD SiCOH deposition, minor polarized CMP and removal of SAM by wet or dry etch is performed and selective organosilicon growth on SiOx (SiCOH) and UV cure can be implemented as mentioned above.

Stated differently, cyclic SAM grafting and cross-linking bonding by thermal and UV cure is employed to form a stable and thicker SAM with vertical cross-linking bonding by thermal/UV cure. Subsequently, partial planarization selective deposition with FCVD SiCOH at, e.g., about 80° C. and UV cure (about 200° C. to about 300° C.). Then CMP is performed to remove excess FCVD SiCOH and SAM removal is performed to form a selective FAV structure. In another processing option, depending on the type of SiCOH film, the UV cure step can be implemented after the CMP step and prior to the SAM removal step for improvement in stability. In another dielectric material option, the selective SiCOH can also be formed by long chain cross-linking organosilicon SAM with UV cure.

Figure 10:
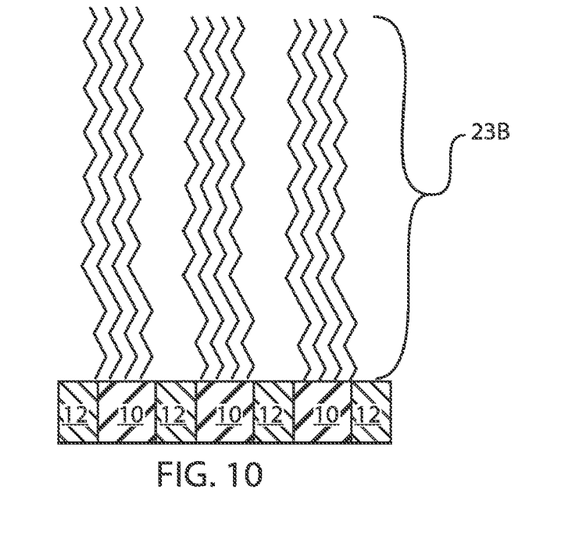
FIG. 10 is a cross-sectional view of the semiconductor structure of FIG. 9 where a single long SAM chain is formed instead of a layered SAM, in accordance with an alternative embodiment of the present invention.

FIG. 10 is a cross-sectional view of the semiconductor structure of FIG. 9 where a single long SAM chain is formed instead of a layered SAM, in accordance with an alternative embodiment of the present invention.

In various example embodiments, a single long chain SAM 23B is formed instead of a layered SAM 23A. Thus, after formation of structure 28, the ILD 24 can be deposited and planarized, the single long chain SAM 23B can be removed, and an opening can be formed. The opening can be a via for a fully aligned via (FAV) structure.

Figure 11:
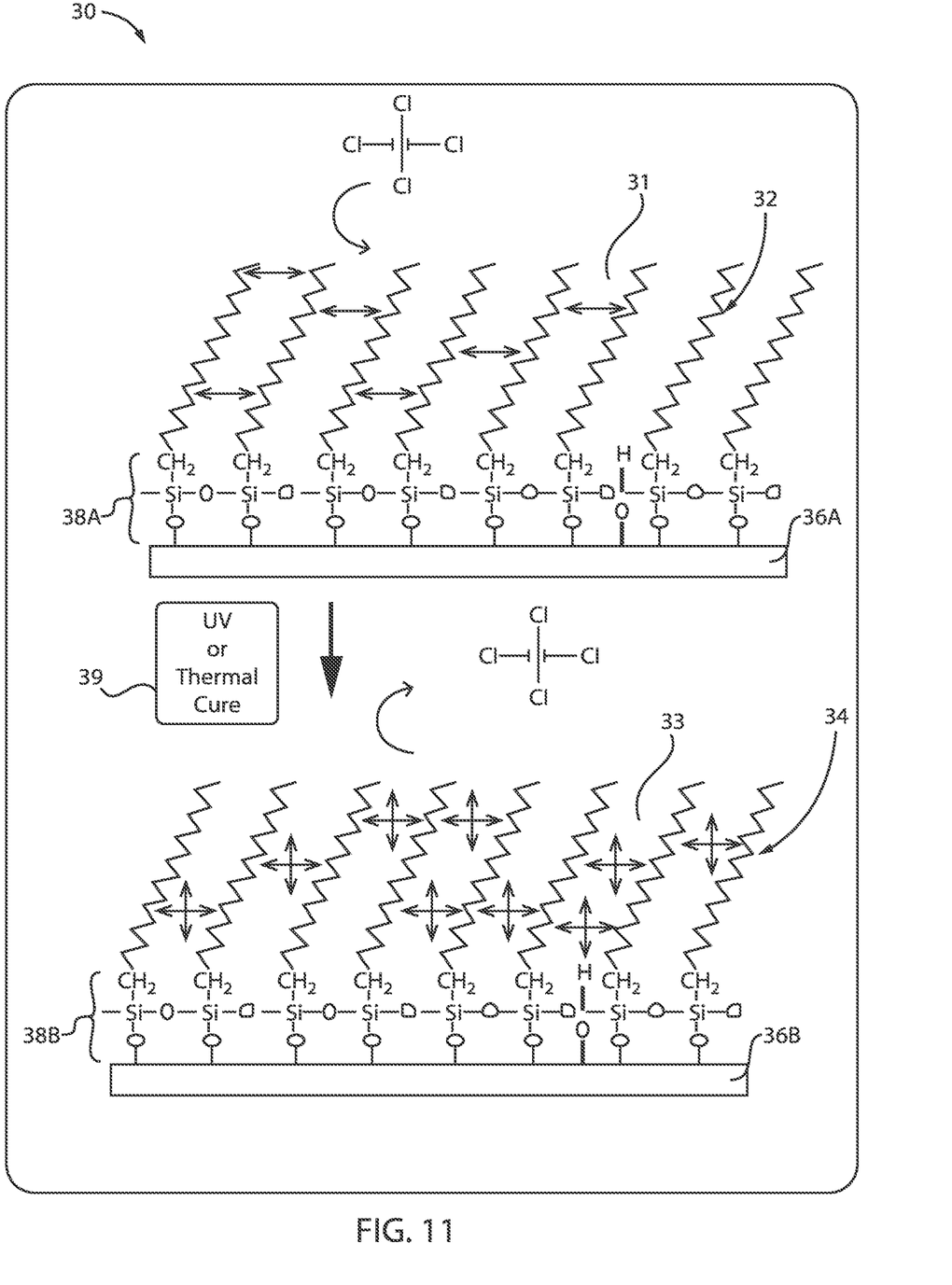
FIG. 11 is an exemplary structure illustrating cross-link bonding where lateral growth is minimized, in accordance with an embodiment of the present invention.

FIG. 11 is an exemplary structure illustrating cross-link bonding where lateral growth is minimized, in accordance with an embodiment of the present invention.

Structure 30 illustrates, in the top section, minimization of lateral growth 31 between SAM chains 32 and in the bottom section, cross-link bonding 33 between SAM chains 34. The SAM chains 32 are connected to a substrate 36A via head group 38A and the SAM chains 34 are connected to a substrate 36B via a head group 38B. A thermal cure and UV cure 39 can be applied to the SAM chains 32 or 34 to bond further SAMs over the SAM chains 32 or 34.

Therefore, after the SAM growth on metal, by using a similar strategy on passivation of metal (Cu, Co, W, etc.) with SAM, the dielectric surface can be selectively grown on $SiO_2$ (or SiCOH) with cyclic organosilicon long chain molecules to minimize the lateral growth. The organosilicon can have crosslinking side chain groups branching molecules for the creation of a stable long chain.

Figure 12:
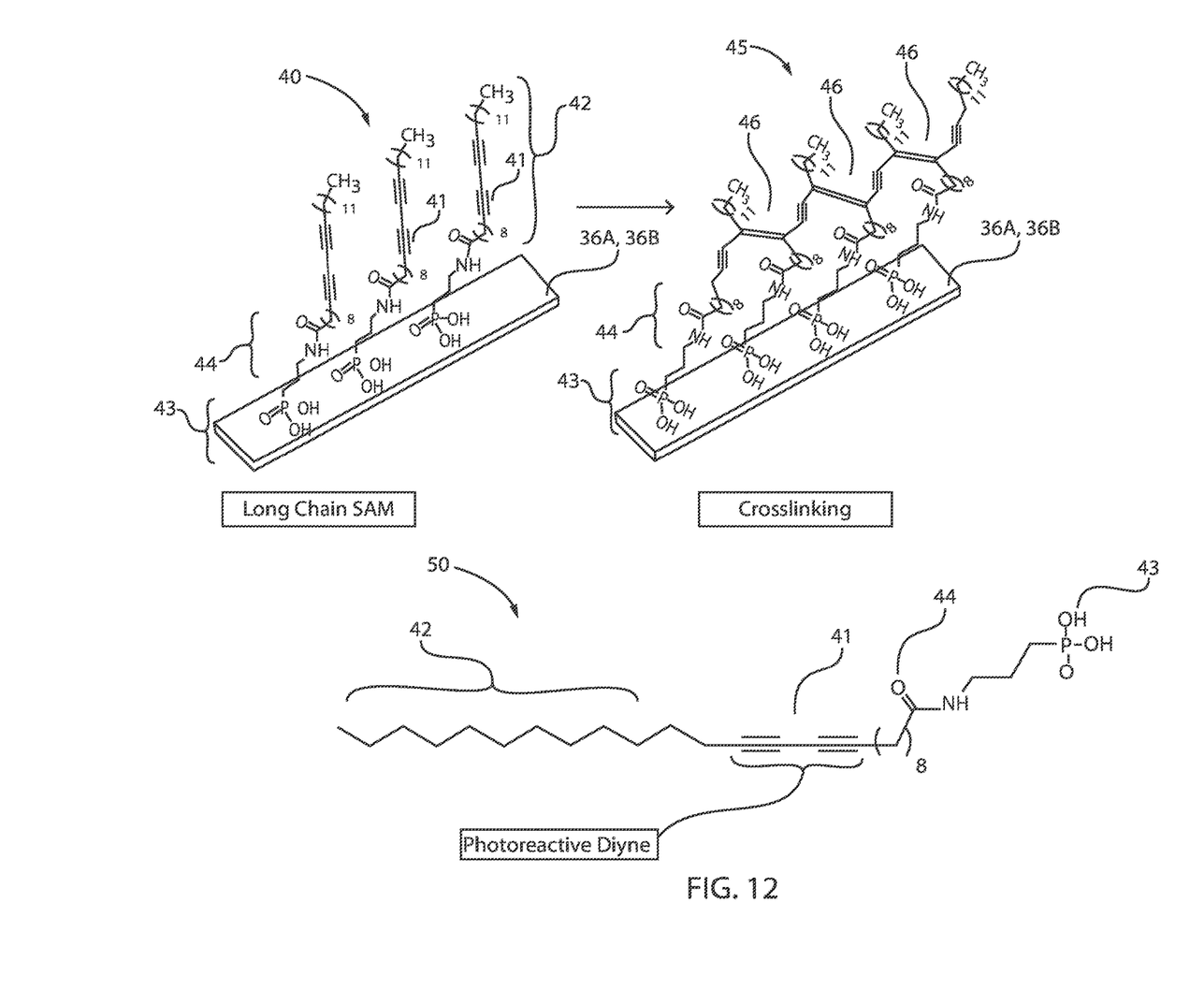
FIG. 12 is an exemplary three-dimensional structure illustrating cross-link bonding where lateral growth is minimized, in accordance with an embodiment of the present invention.

FIG. 12 is an exemplary three-dimensional structure illustrating cross-link bonding where lateral growth is minimized, in accordance with an embodiment of the present invention.

Structure 40 illustrates the construction of long chain SAMs 42 over substrate 36A, 36B. The long chain SAMs 42 are connected to the substrate by head group 44.

Structure 45 illustrates the polymerization 46 between SAM chains 42.

Diagram 50 depicts the photoreactive diyne.

Figure 13:
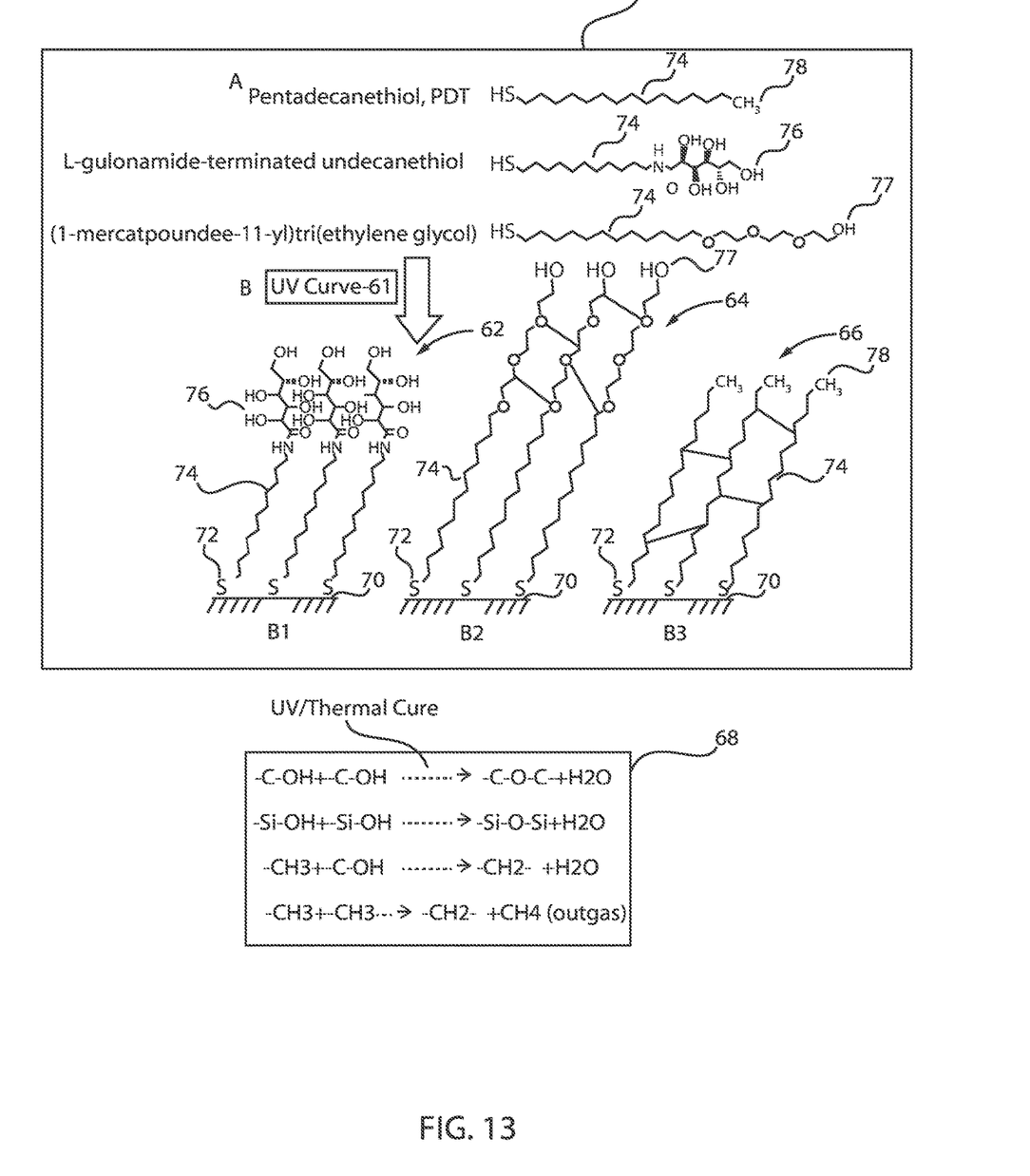
FIG. 13 illustrates exemplary long chain SAM structures having different head groups, in accordance with an embodiment of the present invention.

FIG. 13 illustrates exemplary long chain SAM structures having different head groups, in accordance with an embodiment of the present invention.

Other long chain SAM groups 60 can also be bonded to a metal surface 70. These include head group 78 ($CH_3$) shown in structure 66, head group 77 (HO) shown in structure 64, and headgroup 76 (—Si(OH)x) shown in structure 62. Each structure 62, 64, 66 has SAM chains 74 connected to a conductive layer 70 via head groups 72.

Reactions 68 as a result of thermal cure and UV cure are also shown.

Figure 14:
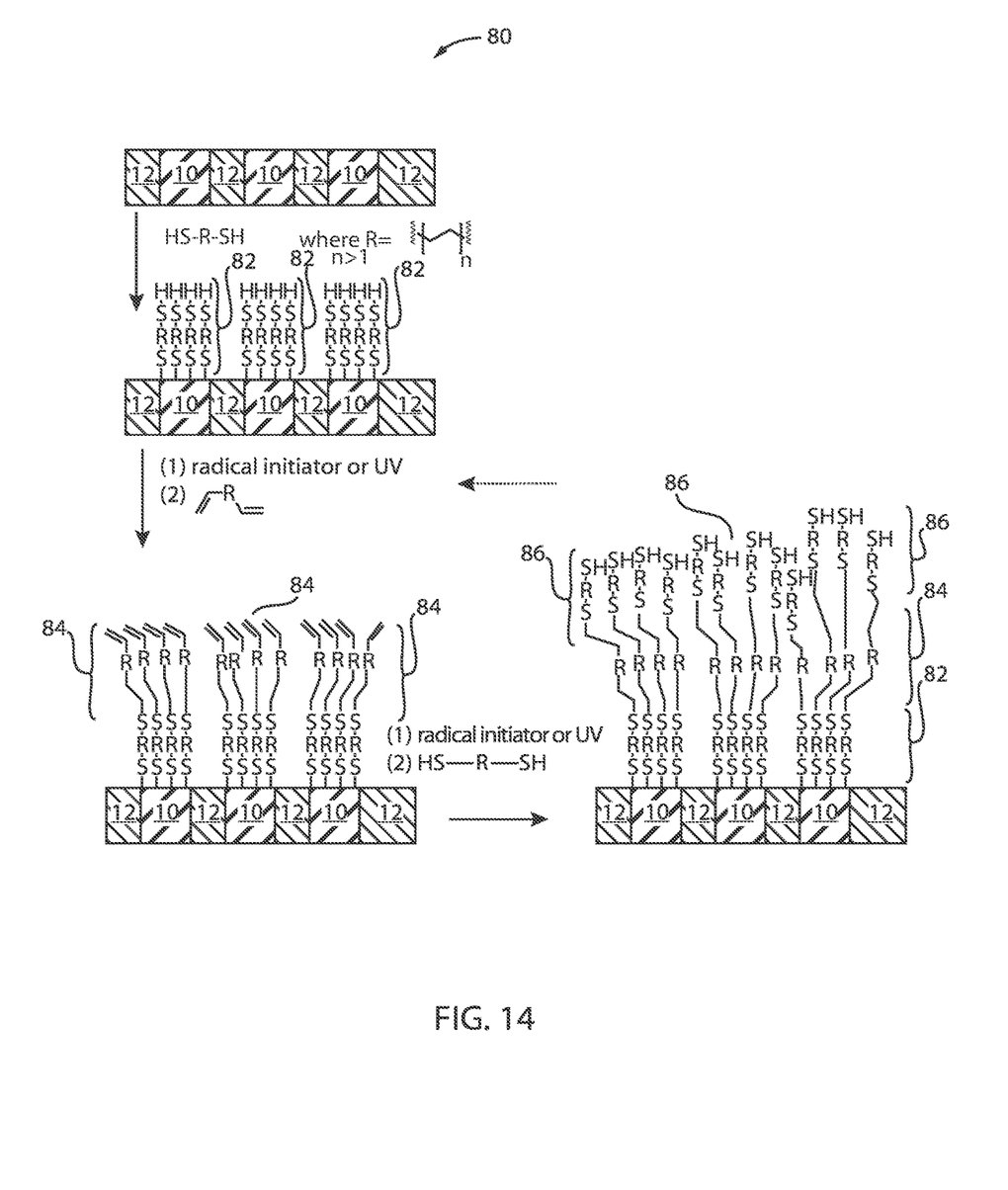
FIG. 14 illustrates an exemplary cyclic SAM, in accordance with an embodiment of the present invention.

FIG. 14 illustrates an exemplary cyclic SAM, in accordance with an embodiment of the present invention.

Structure 80 illustrates the flow of creating a cyclic SAM.

Alternating layers of a conductive material 10 and a dielectric 12 are formed. A first SAM 82 is formed over the conductive regions 10. A second SAM 84 is formed over the first SAM 82. A third SAM 86 is formed over the second SAM 84.

The first SAM 82 includes, e.g., a thiol unit. In particular, the first SAM 82 is produced from a dithiol which, under high concentrations, will anchor one thiol unit to the surface. The other thiol unit is not reacted and can be exploited in a subsequent thiol-ene reaction to produce the thioether SAM 84.

The second SAM 84 includes, e.g., a thiol unit. In particular, exposure of SAM 84 to initiate a radical reaction, with UV or a chemical radical initiator such as ozone, activates the surface for a subsequent reaction with an alkene moiety in a thiolene reaction. Using a difinctional alkene (e.g., diene) (2) in high vapor phase concentration will react with the activated thiol surface to generate SAM 84 where one moiety of the diene reacts with the activated thiol and the other alkene unit can be exploited in subsequent reactions.

The third SAM 86 includes, e.g., a thiol unit. In particular, in the same manner, the thiol was activated with UV or a radical initiator, the alkene from SAM 84 can also be activated, and then reacted with the introduction of another dithol generating SAM 86. This process of activation/reaction between dithiols and dienes can be cycled to build up the SAM thickness with multiple reaction steps.

Figure 15:
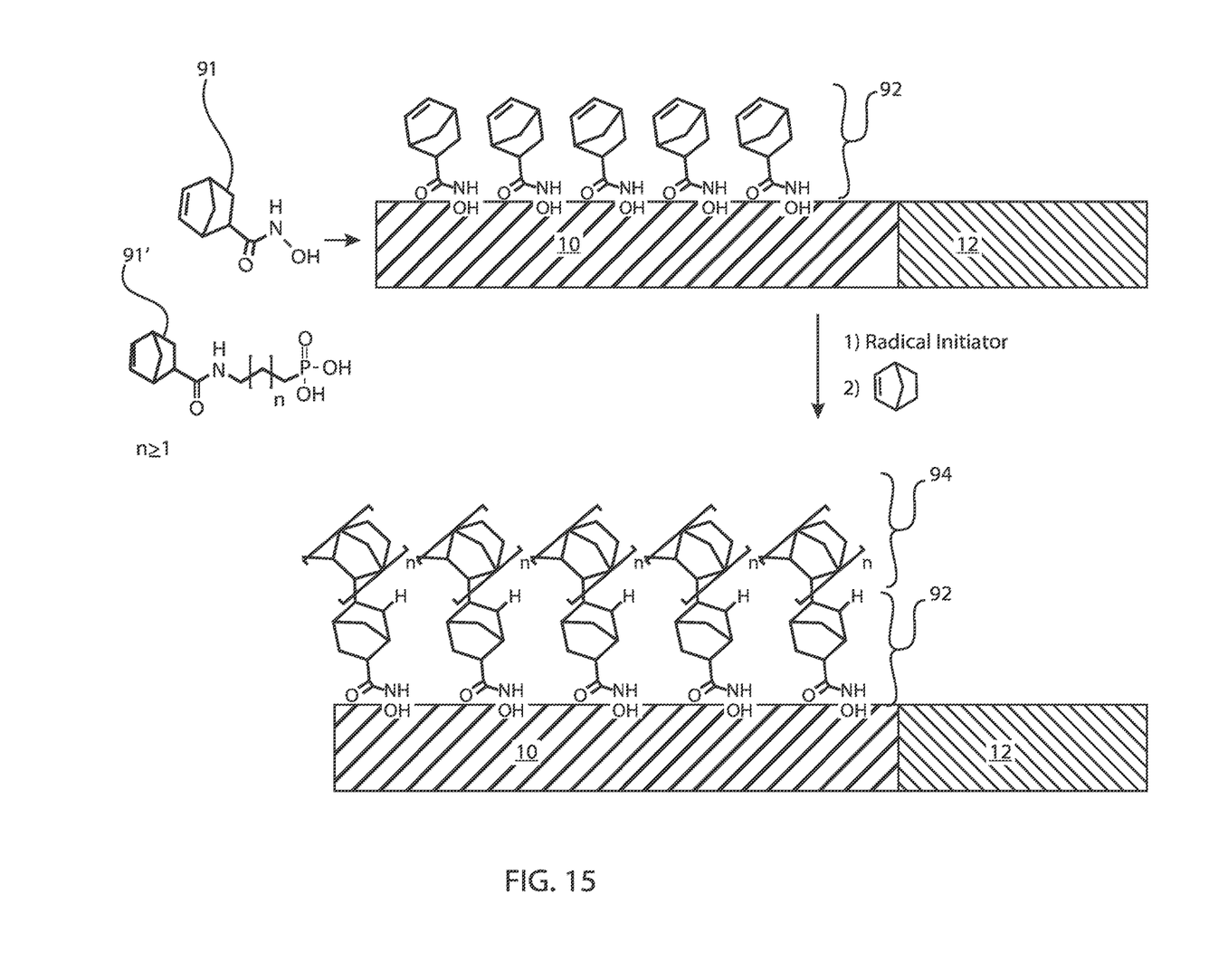
FIG. 15 illustrates an exemplary polymer SAM, in accordance with an embodiment of the present invention.

FIG. 15 illustrates an exemplary polymer SAM, in accordance with an embodiment of the present invention.

Structure 90 illustrates the flow of creating a polymer SAM.

A polymer 91 is employed to form a first series of polymers 92 over a conductive region 10. A second series of polymers 94 can be formed over the first series of polymers 92.

In an alternative embodiment, monomer 91' can also be used, as opposed to polymer 91, to form a series of monomers over the conductive region 10. One skilled in the art can contemplate a plurality of different types of monomers and polymers to be used without limitation.

Figure 16:
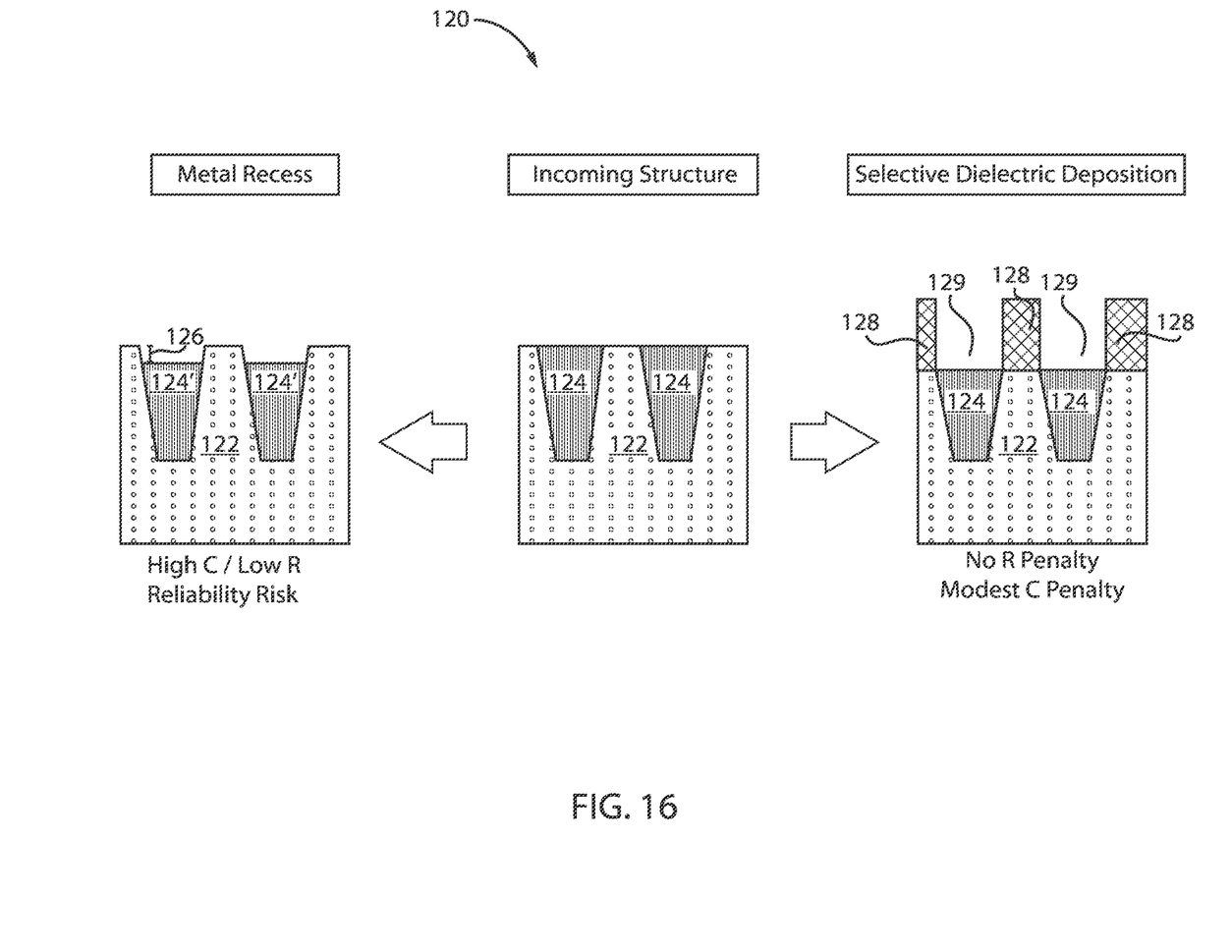
FIG. 16 illustrates the difference between forming a fully aligned via (FAV) by metal recessing versus SAM formation, in accordance with an embodiment of the present invention.

FIG. 16 illustrates the difference between forming a fully aligned via (FAV) by metal recessing versus SAM formation, in accordance with an embodiment of the present invention.

Diagram 120 illustrates the difference between forming a fully aligned via (FAV) by metal recessing versus SAM formation.

The initial or incoming structure includes conductive regions 124 formed in a dielectric 122. In the metal recess method of forming FAV, the conductive regions 124 are recessed by a distance designated by 126 to create recessed conductive regions 124'. In contrast, in the selective dielectric deposition method of the exemplary embodiments, a SAM is formed, a dielectric 128 is deposited and planarized, and then the SAM is removed to create an opening 129 for the FAV. Therefore, deposition of low-K SiCOH provides little resistance-capacitance (RC) penalty for FAV and is tolerant to significant changes in film thickness versus performing a metal recess.

Figure 17:
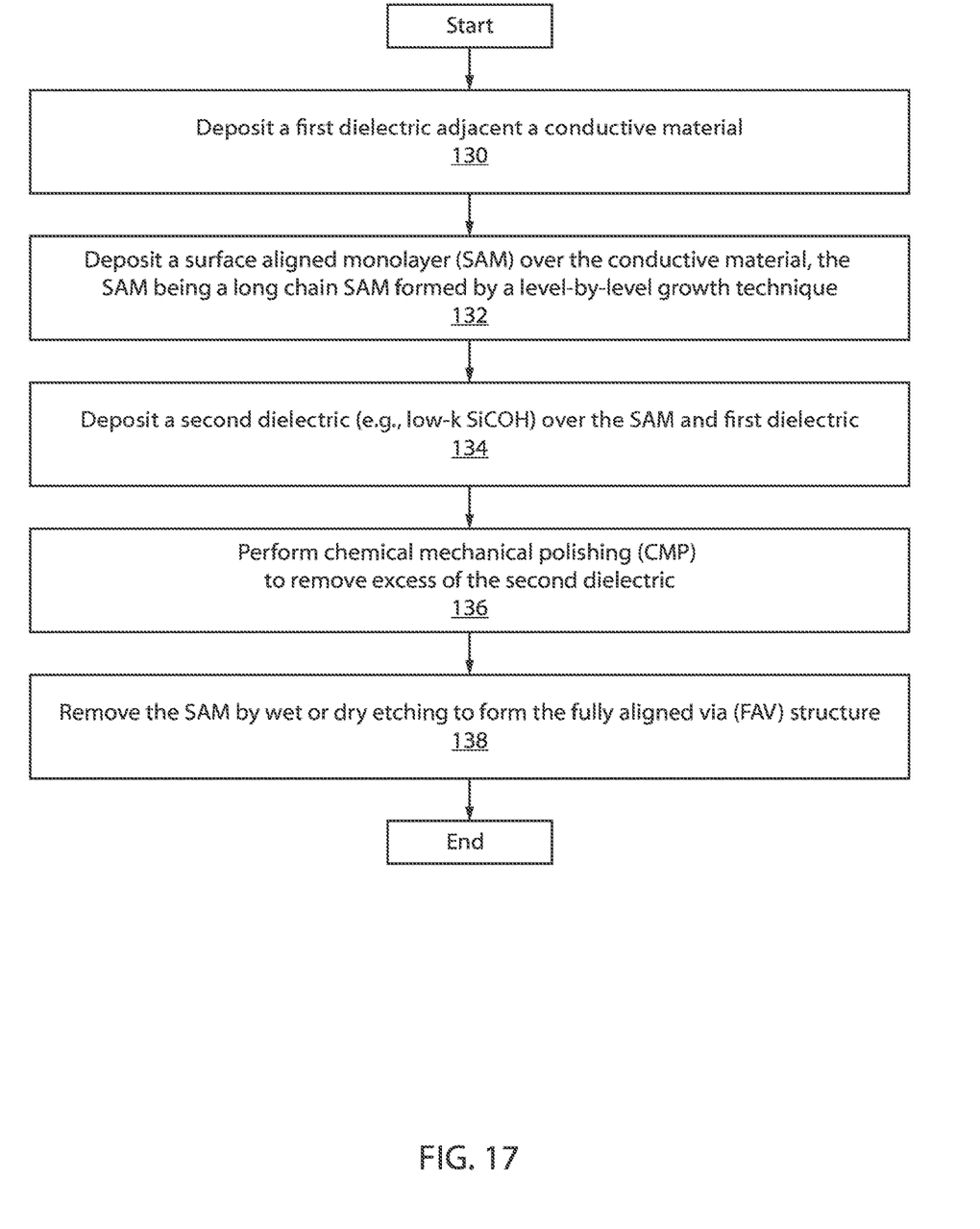
FIG. 17 illustrates a block/flow diagram of an exemplary method for creating a FAV by formation of SAM, in accordance with an embodiment of the present invention.

FIG. 17 illustrates a block/flow diagram of an exemplary method for creating a FAV by formation of SAM, in accordance with an embodiment of the present invention.

At block 130, a first dielectric is deposited adjacent a conductive material.

At block 132, a surface aligned monolayer (SAM) is deposited over the conductive material, the SAM being a long chain SAM formed by a layer-by-layer growth technique.

At block 134, a second dielectric (e.g., low-k SiCOH) is deposited over the SAM and first dielectric.

At block 136, chemical mechanical polishing (CMP) is performed to remove excess of the second dielectric.

At block 138, the SAM is removed by wet or dry etching to form the fully aligned via (FAV) structure.

In summary, the exemplary embodiments of the present invention include an advanced SAM with long chains and stable cross-linking that enables deposition of self-planarized partial selective FCVD SiCOH on low-k dielectrics. By employing a long chain cross-linking surface SAM bonded to metal, lateral growth can be inhibited. After FCVD SiCOH deposition, minor planarized CMP and removal of SAM by wet or dry etch is performed and) and UV cure can be implemented to selective organosilicon growth on SiCOH dielectrics.

Deposition is any process that grows, coats, or otherwise transfers a dielectrics material (e.g., SiCOH, SiOx) onto the wafer are included. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

UV cure is the main processing process method for improving the SAM crossing-linking and the SiCOH dielectrics. As options, other treatments such as thermal cure, E-Beam, microwave cure, etc. can be implemented to achieve the same result.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

The dry and wet etching processes employed in the exemplary embodiments can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a Hydrogen-based chemistry. Hydrogen is the main etchant in this case with various plasma. Other dry etchant gasses can include Ammonia ($NH_3$), Oxygen ($O_2$), Carbon Dioxide ($CO_2$), Nitrous Oxide ($N_2O$), or more reactive Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as deep reactive-ion etching (DRIE). Chemical vapor etching can be used as a selective etching method, and the etching gas can include, Hydrogen ($H_2$), Ammonia ($NH_3$), Oxygen ($O_2$), Carbon Dioxide ($CO_2$), Nitrous Oxide ($N_2O$), or hydrogen chloride (HCl), $CF_4$, and gas mixture with hydrogen ($H_2$). Chemical vapor etching can be performed by CVD with suitable pressure and temperature.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of selective deposition of low-k silicon oxycarbide (SiCOH) with surface aligned molecules (SAM) for creating fully aligned vias (FAVs) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a fully aligned via (FAV) structure, the method comprising:
   depositing a first dielectric adjacent a conductive material;
   forming a surface aligned monolayer (SAM) over the conductive material, wherein the SAM defines a long chain SAM constructed by a layer-by-layer growth technique;

depositing a second dielectric over the SAM and the first dielectric;
performing chemical mechanical polishing (CMP) to planarize the second dielectric;
performing ultraviolet (UV) cure; and
etching the SAM to form the FAV structure.

2. The method of claim 1, wherein the first dielectric is an inter-layer dielectric (ILD) and the second dielectric is a low-k silicon oxycarbide (SiCOH).

3. The method of claim 1, wherein the long chain SAM includes a first SAM, a second SAM, and a third SAM, the first, second, and third SAMs formed one on top of each other in a stacked configuration.

4. The method of claim 3, wherein the first SAM is bonded to the second SAM and the second SAM is bonded to the third SAM by thermal and ultraviolet (UV) cure.

5. The method of claim 1, wherein the long chain SAM is 3-30 nm in length.

6. The method of claim 1, wherein the long chain SAM has a polymeric chain.

7. The method of claim 1, wherein the long chain SAM has a cyclic chain.

8. The method of claim 1, wherein lateral overgrowth of SiCOH dielectric and of chains of the long chain SAM is inhibited by cross-link bonding and long/high dense SAM formation on metal.

9. A method for forming a fully aligned via (FAV) structure, the method comprising:
forming a first dielectric adjacent a conductive material;
forming a first surface aligned monolayer (SAM) over the conductive material, wherein the SAM defines a long chain SAM formed by a single long chain SAM or by:
applying a first thermal and UV cure;
forming a second SAM over and in direct contact with the first SAM;
applying a second thermal and UV cure;
forming a third SAM over and in direct contact with the second SAM;
depositing a second dielectric over the third SAM and the first dielectric;
performing chemical mechanical polishing (CMP) to planarize the second dielectric; and
etching the SAM to form the FAV structure.

10. The method of claim 9, wherein the first dielectric is an inter-layer dielectric (ILD) and the second dielectric is a low-k silicon oxycarbide (SiCOH).

11. The method of claim 10, wherein the first, second, and third SAMs are formed in a stacked configuration.

12. The method of claim 9, wherein the long chain SAM is 3-30 nm in length.

13. The method of claim 9, wherein the long chain SAM has a polymeric chain.

14. The method of claim 9, wherein the long chain SAM has a cyclic chain.

15. The method of claim 9, wherein lateral growth of chains of the long chain SAM is inhibited by cross-link bonding.

16. The method of claim 9, wherein the second dielectric is deposited by flowable chemical vapor deposition (FCVD) at about 80° C. using organosilicon and oxygen precursors.

* * * * *

UNITED STATES PATENT AND TRADEMARK OFFICE
CERTIFICATE OF CORRECTION

PATENT NO. : 11,171,054 B2
APPLICATION NO. : 16/837075
DATED : November 9, 2021
INVENTOR(S) : Nguyen et al.

It is certified that error appears in the above-identified patent and that said Letters Patent is hereby corrected as shown below:

On the Title Page

Item (72) Inventors: DELETE "Balasubramanian S. Pranatharthi Haran" and INSERT --Balasubramanian S. Pranatharthiharan.--

Signed and Sealed this
Thirty-first Day of May, 2022

Katherine Kelly Vidal
*Director of the United States Patent and Trademark Office*